United States Patent
Masters et al.

(10) Patent No.: US 9,678,117 B2
(45) Date of Patent: Jun. 13, 2017

(54) INTEGRAL SAFETY DISPLAY FOR A TEST SWITCH

(71) Applicant: ABB Technology AG, Zurich (CH)

(72) Inventors: Timothy F. Masters, The Woodlands, TX (US); Roy Ball, Andover, MA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/654,893

(22) PCT Filed: Dec. 22, 2013

(86) PCT No.: PCT/US2013/077362
§ 371 (c)(1),
(2) Date: Jun. 23, 2015

(87) PCT Pub. No.: WO2014/105769
PCT Pub. Date: Jul. 3, 2014

(65) Prior Publication Data
US 2015/0339908 A1    Nov. 26, 2015

Related U.S. Application Data

(60) Provisional application No. 61/745,937, filed on Dec. 26, 2012.

(51) Int. Cl.
| | |
|---|---|
| *G01R 19/00* | (2006.01) |
| *G01R 19/145* | (2006.01) |
| *G01R 19/15* | (2006.01) |
| *G01R 19/155* | (2006.01) |
| *H01H 13/70* | (2006.01) |
| *H01H 71/04* | (2006.01) |

(52) U.S. Cl.
CPC ............ *G01R 19/145* (2013.01); *G01R 19/00* (2013.01); *G01R 19/15* (2013.01); *G01R 19/155* (2013.01); *H01H 13/70* (2013.01); *H01H 71/04* (2013.01)

(58) Field of Classification Search
CPC ...... G01R 19/145; G01R 31/00; G01R 31/02; G01R 19/00; G01R 19/0007; G01R 19/0023; G01R 19/15; G01R 19/155; G01R 19/165; G01R 19/16566; G02B 6/3817; G02B 6/3897; G02B 6/4452
See application file for complete search history.

(56) References Cited

U.S. PATENT DOCUMENTS

| | | | | |
|---|---|---|---|---|
| 5,265,187 | A * | 11/1993 | Morin | G02B 6/3817 385/135 |
| 7,295,130 | B2 * | 11/2007 | Luebke | G01R 1/06788 324/76.11 |
| 7,307,408 | B2 * | 12/2007 | Porcu | G01R 31/023 324/508 |

(Continued)

*Primary Examiner* — Van Trieu
(74) *Attorney, Agent, or Firm* — Taft Stettinius & Hollister LLP

(57) ABSTRACT

An electrical test switch has an integral energized circuit indicator. The energized circuit indicator is integrated into the front and/or rear covers of the test switch. The energized circuit indicator is passive and senses properties of the at least one conductor of the device being tested by being placed in proximity of the device. The voltage display provides personnel a visual indication of whether the electrical device being tested is energized without requiring a physical test or direct connection to the at least one conductor of the device being measured.

12 Claims, 4 Drawing Sheets

(56) References Cited

U.S. PATENT DOCUMENTS

| | | | | |
|---|---|---|---|---|
| 2005/0146319 A1* | 7/2005 | Weems, II | ............ | G01R 35/00 |
| | | | | 702/61 |
| 2005/0237048 A1* | 10/2005 | Weems, II | ............ | G01R 35/00 |
| | | | | 324/115 |
| 2006/0255788 A1* | 11/2006 | Porcu | ................... | G01R 31/023 |
| | | | | 324/66 |
| 2010/0033190 A1* | 2/2010 | Devine | ................ | G01R 19/145 |
| | | | | 324/537 |

* cited by examiner

INTEGRAL SAFETY DISPLAY FOR A TEST SWITCH

FIELD OF INVENTION

The present application is directed to an electrical test switch having an integral safety display.

BACKGROUND

Test switches facilitate maintenance and troubleshooting for protective relays and other electrical devices. In a typical installation, the test switches are located between the system sensors and protective relays, as part of the high-voltage system. After system sensors such as current and voltage transformers reduce the magnitude of the current and voltage of the system to values that the test switches can utilize, the test switches further route the energy sources in an electrical installation.

Technicians require access to the front and/or rear panels of the test switches to perform maintenance as well as troubleshoot during fault events occurring on the system. However, safely accessing the test switch panel necessitates the technician determining the energized status of the conductors in the switch and the multiple power sources before beginning work.

SUMMARY

An electrical test switch that optically represents the energized status of conductors within the switch has front and rear covers for housing the at least one conductor or a connection to the at least one conductor. An energized circuit indicator is embedded in a top surface of the front and/or rear covers. The energized circuit indicator has a display that optically represents the detection or absence of at least one property of the conductor being measured when the conductor is disposed proximate to the energized circuit indicator.

A method for optically indicating the presence of voltage for at least one conductor of a test switch has the following steps:
a) integrating an energized circuit indicator within a front or rear cover of a test switch, the test switch comprising at least one conductor;
b) measuring a property of the at least one conductor;
c) interpreting at least one property of the measured conductor; and
d) transmitting via the energized circuit indicator an optical indication of the at least one property of the measured conductor.

BRIEF DESCRIPTION OF THE DRAWINGS

In the accompanying drawings, structural embodiments are illustrated that, together with the detailed description provided below, describe exemplary embodiments of an integral safety display for a test switch. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
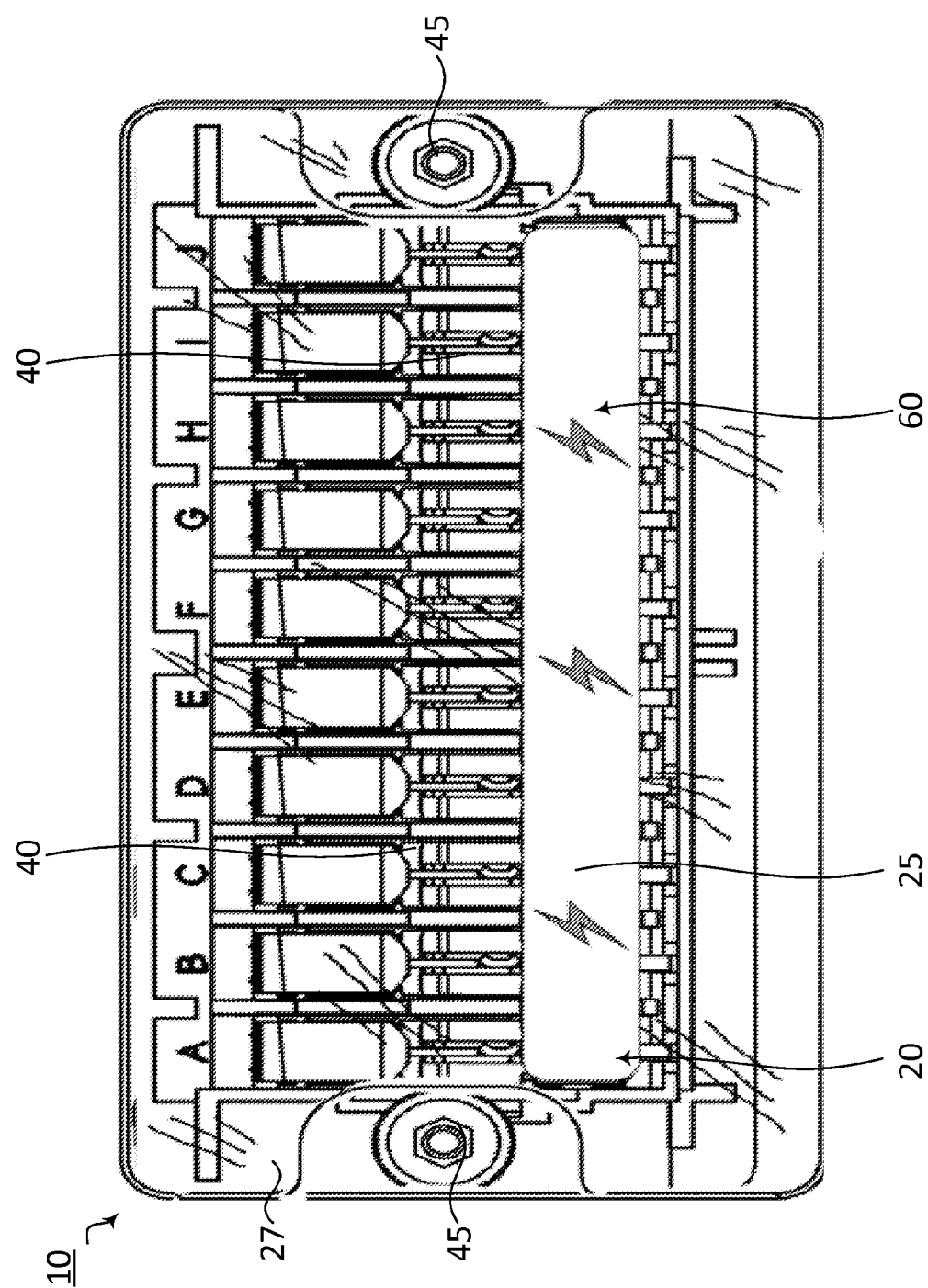
FIG. 1 is a perspective view of a test switch having a clear front cover and an integral safety display indicating that a voltage presence is detected.
Figure 2A:
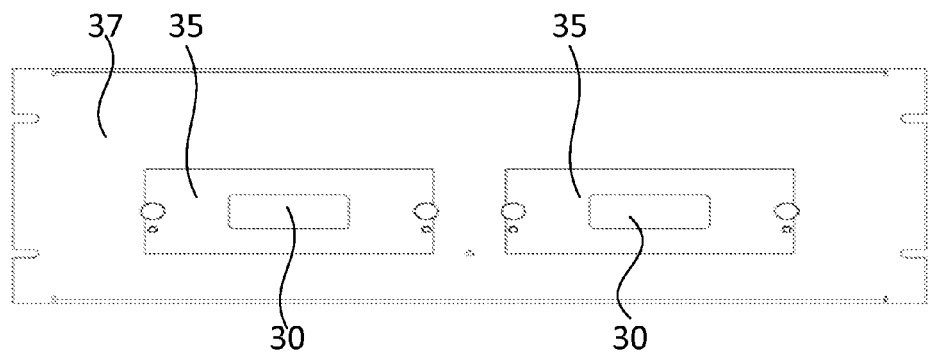
FIG. 2a is a rear view of the test switch having two rear safety displays.

A test switch 10 for electrical applications, having integral front and rear safety displays, 20, 30 is depicted in FIGS. 1 and 2a. The front display 20 is embedded in a front cover 27 and the rear display 30 is embedded in the rear cover 37. Both the front and rear covers 27, 37 house at least one conductor 40 of the test switch 10. The at least one conductor 40 of the test switch is a pole, switch unit, or another type of electrical conductor.

The at least one conductor 40 is mounted to a base 50 of the test switch 10. Although an exemplary 10-pole electrical test switch 10 is depicted in FIG. 1, it should be understood that safety displays 20, 30 may be embedded in the front and/or rear covers 27, 37 of other types of electrical devices in order to carry out the invention. The test switch 10 of the present invention is embodied having a single front cover 27 display 20, one or more rear cover 37 displays 30, or both front and rear cover 27, 37 displays 20, 30 depending on the application.

The front and rear displays 20, 30 are configured to detect a voltage presence within a proximity of the at least one conductor 40 being measured. The electric field that is present when the at least one conductor 40 being measured is energized, provides the power source for the operation of the front and rear displays 20, 30 and indicator lights 22.

As depicted in FIG. 1, the at least one conductor 40 is energized in the switch 10 as depicted by the front display 20. In the exemplary embodiment, the front display 20 has a series of lightning bolts prominently displayed thereon. Each lightning bolt 60 represents a single energized conductor or voltage presence in one of the at least one conductors 40 without an indication of the exact one of the at least one conductors 40 that is energized.

Otherwise, if the front and/or rear display 20, 30 does not detect a voltage presence, the display 20, 30 is blank, with no figures, symbols or illuminated indicator lights thereon. In this manner, personnel accessing the test switch 10 from either side of the switch 10 are presented with an optical indication of the energized status of the at least one conductor 40 of the test switch 10 or conductors in connection to the test switch 10.

A front indicator strip 25 having four sides, a top surface and a bottom surface is embedded within the front cover 27. Alternatively, the front indicator strip 25 is circular or in the shape of any polygon. The front indicator strip 25 is a layer of liquid crystal surrounded by a substrate on opposing sides of the liquid crystal layer. The front indicator strip 25 is embedded within the front cover 27 of the test switch 10 so that all four sides, and the top and bottom surface of the strip 25 are surrounded by material from which the covers 27, 37, respectively, are formed. Alternatively, all four sides and the top surface of the strip 25 are embedded in the front cover 27 and the bottom surface of the strip 25 is not in contact with material of the front cover 27 or any other material. The bottom surface of the strip 25 is placed proximate to, and without touching the at least one conductor 40 in order to detect voltage presence or absence.

In one embodiment, the front cover 27 is formed from a polycarbonate and the rear cover 37 is formed from acrylonitrile butadiene styrene (ABS). The covers, 27, 37 may be clear or opaque depending on the installation and materials used therein. It should be understood that other suitable materials for forming the front and rear covers 20, 25 may be utilized. The front cover 27 is secured to the base 50 using thumbnuts 45.

On a front side of the test switch 10, the live elements of the at least one conductor 40 may include the poles, switch blades and corresponding contact sheaths. On the rear side of the test switch 10, the live elements may include the power sources, connections to the power sources, terminal nuts, terminal screws, and terminal wire lugs.

Figure 1A:
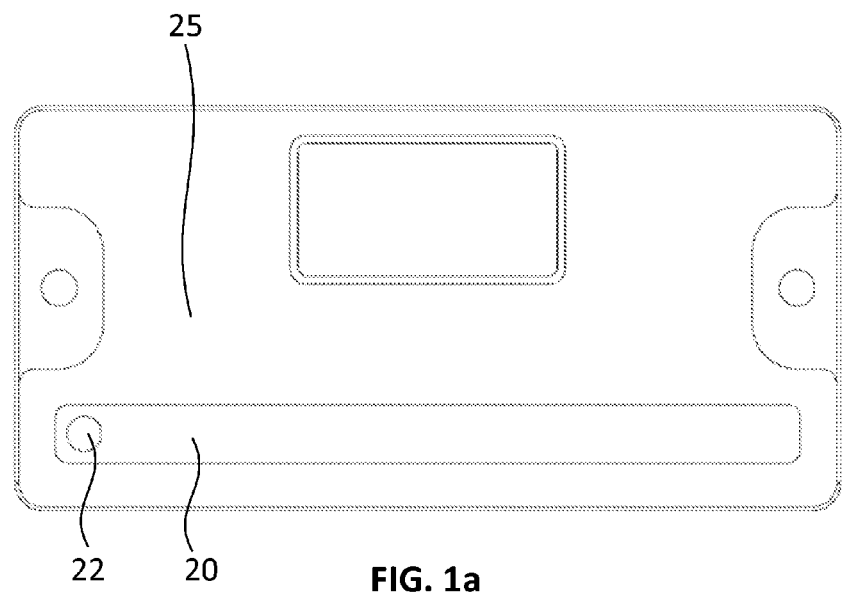
FIG. 1a is a front view of the test switch having an opaque cover and the integral safety display having an LED and wherein both the safety display and LED indicate that a voltage presence is not detected.
Figure 1B:
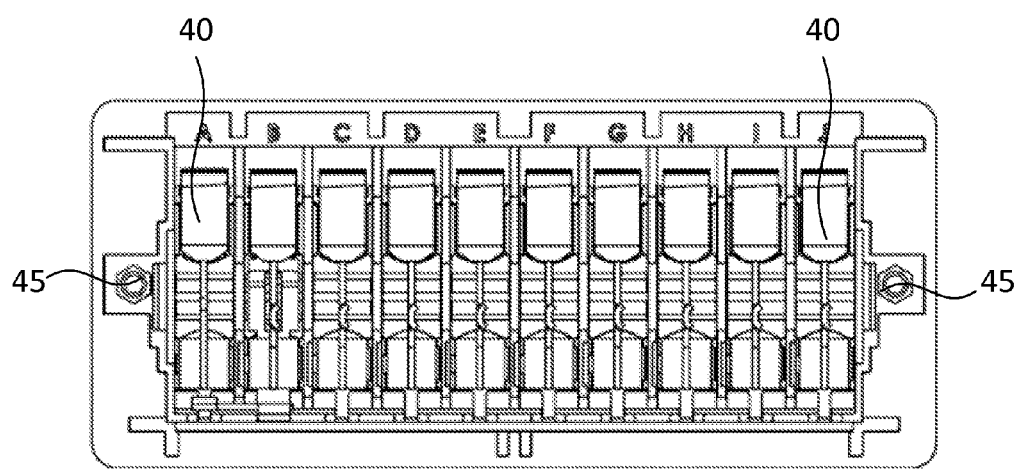
FIG. 1b is a front view of the test switch having the front cover removed.

Referring now to FIG. 1a, the test switch 10 having an opaque cover 25, an indicator light 22, and a front display 20 is depicted. The front display 20 and indicator light 22 provide an optical, visible indication of the energized status of a circuit in connection with the test switch 10. In FIG. 1a, the front display 20 is absent of figures or symbols indicating voltage presence and the indicator light 22 is not illuminated. This means that voltage presence was not detected by the front display 20.

The indicator light 22 may be a light emitting diode (LED) or another type of indicator light suitable for carrying out the invention. In one embodiment, indicator light 22 is illuminated in the case of voltage presence and not illuminated when the display 20 detects a voltage below a predetermined threshold. The detectable range of voltage is from about zero volts to about 600 volts. It should be understood that indicator lights 22 may be used on the rear cover 37 of the test switch 10 for the same purposes as used on the front cover 27. The indicator light 22 is illuminated in the case of detection of voltage presence.

Figure 1C:
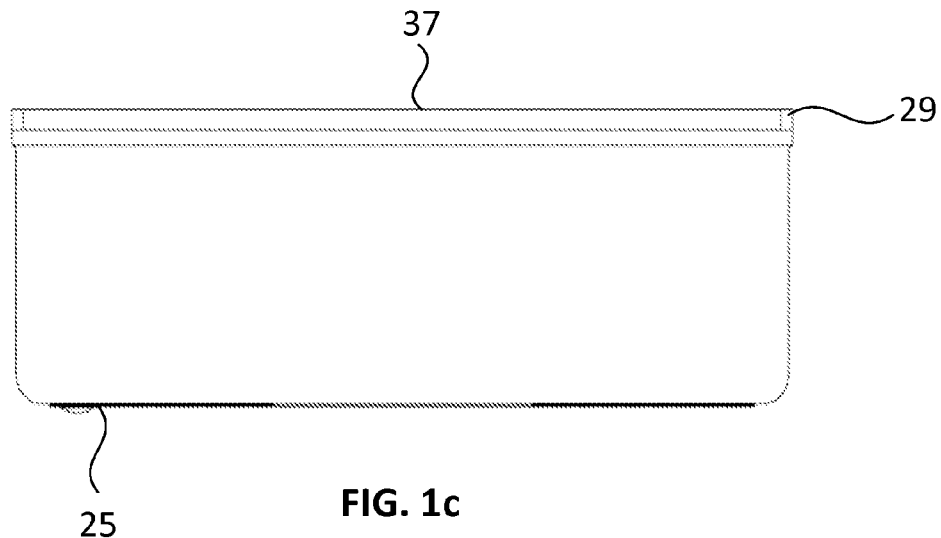
FIG. 1c shows a top view of the front cover of the test switch.
Figure 1D:
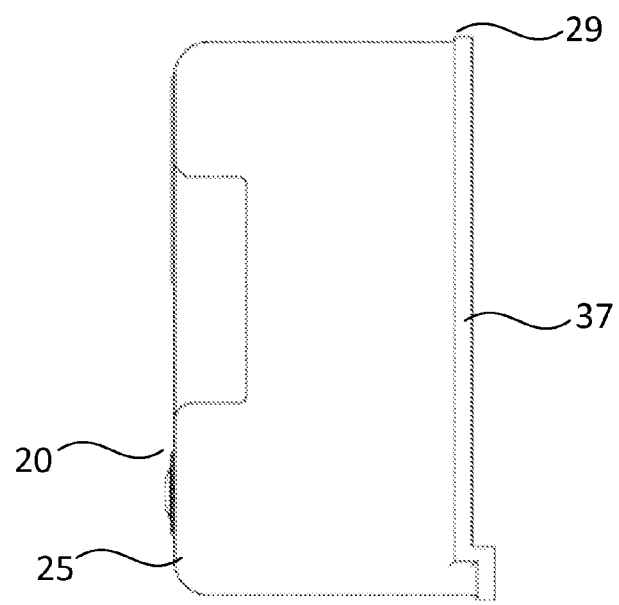
FIG. 1d is a side view of the front cover of the test switch.

Referring now to FIGS. 1c and 1d, top and side views of the front cover 27 are depicted. The rear cover 37 interfaces with the front cover 27 at interface 29.

Figure 2B:
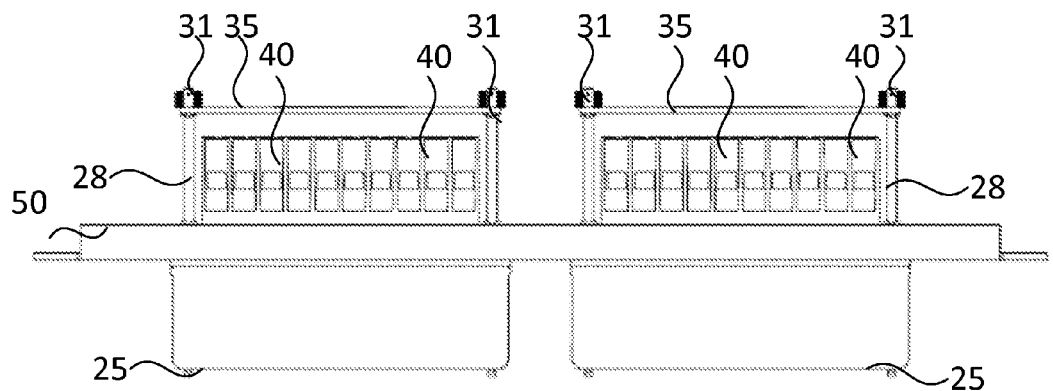
FIG. 2b is a side elevational view of the rear of the test switch.
Figure 2C:
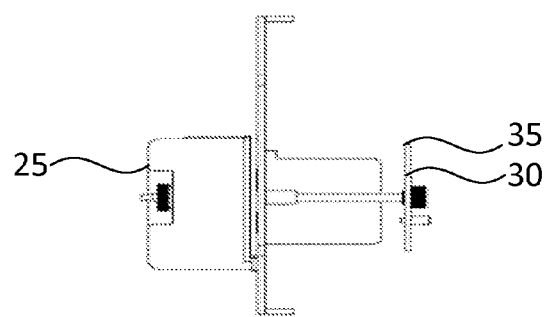
FIG. 2c is a side view of the rear of the test switch.

Referring now to FIGS. 2a, 2b, and 2c, the rear cover 37 of the test switch 10 is depicted. The rear cover 37 of the test switch 10 houses an area used to make connections to power sources or sensors that step down the magnitude of the power sources to values that the test switch 10 and relays can handle. The rear cover 37 has rear displays 35 with indicator strips 30 embedded therein for detecting voltage presence. The rear cover 37 is connected to the base 50 using bolts 28 and thumbnuts 31. Each of the rear displays 35 has at least one conductor 40 or a connection to at least one conductor 40 of electricity housed therein. Each of the indicator strips 30 are embedded within the rear display 35 in the same manner as described above for the front display 20. That is, the rear indicator strip 25 is circular or has the shape of any polygon.

The indicator strips 30 of the rear display 35 present an optical indication of voltage presence using lightning bolt(s) and/or an illuminated indicator light 22 to indicate voltage is present in the at least one conductor 40. In one embodiment, the indicator strips and/or lights are used to provide an optical indication of the presence of another property of the at least one conductor 40.

The front and rear indicator strips 25, 30 have three layers, as is further described in U.S. Pat. No. 7,336,338, the contents of which are incorporated by reference herein. The layers of the front and rear indicator strips 25, 30 are first and second substrate layers and a liquid crystal layer disposed between the first and second substrate layers. A first conducting layer is deposited on the first substrate layer and a second conducting layer is deposited on the second substrate layer.

The strips 25, 30 may be formed of segments of liquid crystal connected together in series to adjacent liquid crystal segments, the electrical connections being made through segments of the first or second conduction layers. The liquid crystal layers of the front and rear indicator strips 25, 30 change optical properties in the presence of an alternating current (AC) electric field to provide a visible indication of voltage presence. In an embodiment having segments of liquid crystal connected to adjacent liquid crystal segments using conductive layers of copper or aluminum, for example, various shapes and indicators may be formed, such as the lightning bolts of FIG. 1. The energized circuit indicator strips 25, 30 provide a passive sensing of voltage presence within proximity of the device being tested.

In one embodiment, the energized circuit indicator strips 25, 30 provide a visual indication that the circuit is energized when nearly zero voltage is present or detectable at the test switch 10, but current is present at a detectable value in the at least one conductor 40 of the test switch 10. It should be understood that the strips 25, 30 are operable to provide a visual indication of an energized circuit based on either voltage or current presence in AC applications and based on voltage presence in direct current (DC) applications.

Further, it should be understood that current and voltage detectors may be installed with the switch 10 and in contact with the at least one conductor 40 of the test switch 10. The current and voltage detectors provide signals representing current and voltage values that are interpreted by the energized circuit sensing display embedded in the front and/or rear covers of the test switch. The energized circuit sensing display then provides a visual indication of the presence of an energized status of the at least one conductor 40 of the test switch 10.

A method for optically indicating voltage presence for at least one conductor 40 of a test switch 10 has a first step of integrating the energized circuit indicator 25, 35 within a front and/or rear cover 27, 37 of a test switch having at least one conductor 40 housed therein. The energized circuit indicator 25, 35 is placed in close proximity to the at least one conductor 40 of the test switch 10. In one embodiment, the proximity is about an inch or less from a surface of the at least one conductor 40. In other embodiments the proximity is defined as the energized circuit indicator 25, 35 in contact with the at least one conductor 40.

A predetermined property of the at least one conductor 40 is then measured and interpreted. The energized circuit indicator 25, 35 is used to transmit an optical indication of the at least one property of the measured conductor. The at least one property of the measured conductor 40 may be the presence or absence of voltage. An indication of the presence of voltage is made by using a symbol or indicator light 22 alerting personnel to the energized status of the test switch 10.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. An electrical test switch, comprising:
   a front cover, a rear cover and a base, said base having two or more conductors mounted to said base, said front and rear covers coupled to said base; and
   an energized circuit indicator embedded in said front cover, said energized circuit indicator having a display, said energized circuit being disposed proximate to at least a portion of, and not in contact with, said two or more conductors, said display optically representing the detection of a presence of at least one property within an area within a proximity of said two or more conductors and said energized circuit at least when one of said two or more conductors is energized.

2. The electrical test switch of claim 1 wherein said energized circuit indicator is blank to represent an absence of a property of said at least one conductor being measured.

3. The electrical test switch of claim 1 wherein said energized circuit indicator is a LED, said LED illuminated when a predetermined property of said at least one conductor being measured is detected.

4. The electrical test switch of claim 1 wherein said display optically representing the detection of the presence of the at least one property does not provide an indication of which one of said two or more conductors is energized.

5. An electrical test switch, comprising:
   a front cover, a rear cover and a base, said base having at least two conductors mounted to said base, said front and rear covers coupled to said base;
   a first energized circuit indicator embedded in said front cover, said first energized circuit indicator having a display; and
   a second energized circuit indicator embedded in a said rear cover, said first and second energized circuits being disposed proximate to at least a portion of said at least two conductors, said first and second displays optically representing the detection of at least one property of one or more conductors of said at least two conductors when at least one of said at least two conductors is energized, the optical representation of the detection by the first and second displays does not provide an indication of which one of said at least two conductors is energized.

6. The electrical test switch of claim 5 wherein the property being measured is the presence or absence of voltage in at least one conductor.

7. The electrical test switch of claim 5 wherein the property being measured is the presence or absence of current in the at least one conductor.

8. The electrical test switch of claim 5 wherein said first and second energized circuits are not in contact with said at least one conductor, and wherein said at least one property is detected by said first and second energized circuits in an area in proximity to said at least one conductor and said first and second energized circuits.

9. A method for optically indicating the presence of an electrical property of at least one conductor of a test switch, comprising:
   a. integrating an energized circuit indicator within a cover of a test switch, the test switch comprising a plurality of conductors;
   b. measuring the electrical property of at least one conductor of a plurality of conductors;
   c. interpreting at least one electrical property of the measured conductor; and
   d. transmitting via the energized circuit indicator an optical indication of the at least one property of the measured conductor at least when one conductor of the plurality of conductors is energized, the optical indication not providing an indication of which one of the plurality of conductors is energized.

10. The method of claim 9 wherein the at least one property measured is the presence or absence of voltage in at least one of the plurality of conductors.

11. The method of claim 9 wherein the at least one property measured is the presence or absence of current in at least one of the plurality of conductors.

12. The method of claim 9 wherein the step of measuring the electrical property comprises detecting, by the energized circuit, the presence of the electrical property in an area proximate to at least one of the plurality of conductors, the electrical property being at least one of voltage and current.

* * * * *